(12) United States Patent
Pofahl et al.

(10) Patent No.: US 9,955,612 B2
(45) Date of Patent: *Apr. 24, 2018

(54) EXHAUST AIR DEFLECTING SYSTEM

(71) Applicant: LEVEL 3 COMMUNICATIONS, LLC, Broomfield, CO (US)

(72) Inventors: Morgan Morrison Pofahl, Tulsa, OK (US); Dolf Conrad Veit, Fort Lupton, CO (US)

(73) Assignee: Level 3 Communications, LLC, Broomfield, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 15/262,811

(22) Filed: Sep. 12, 2016

(65) Prior Publication Data

US 2016/0381837 A1    Dec. 29, 2016

Related U.S. Application Data

(63) Continuation of application No. 14/097,986, filed on Dec. 5, 2013, now Pat. No. 9,442,541.

(60) Provisional application No. 61/733,851, filed on Dec. 5, 2012.

(51) Int. Cl.
  *H05K 7/20* (2006.01)
  *G06F 1/20* (2006.01)
  *H05K 7/14* (2006.01)
  *H05K 7/18* (2006.01)

(52) U.S. Cl.
  CPC ......... *H05K 7/20736* (2013.01); *G06F 1/20* (2013.01); *H05K 7/1488* (2013.01); *H05K 7/183* (2013.01); *H05K 7/20145* (2013.01); *H05K 7/20718* (2013.01)

(58) Field of Classification Search
  USPC .......................................... 361/694
  See application file for complete search history.

(56) References Cited

U.S. PATENT DOCUMENTS

| | | | |
|---|---|---|---|
| 3,192,306 A | 6/1965 | Skonnord | |
| 6,412,292 B2 | 7/2002 | Spinazzola | |
| 6,494,050 B2 | 12/2002 | Spinazzola | |
| 6,557,357 B2 | 5/2003 | Spinazzola | |
| 6,574,970 B2 | 6/2003 | Spinazzola | |
| 6,700,779 B2 * | 3/2004 | Hanson | H05K 7/20581 361/695 |
| 6,722,151 B2 | 4/2004 | Spinazzola | |
| 6,745,579 B2 | 6/2004 | Spinazzola | |
| 6,791,836 B2 | 9/2004 | Cipolla | |
| 7,286,345 B2 * | 10/2007 | Casebolt | G06F 1/20 361/679.48 |
| 7,372,695 B2 | 5/2008 | Coglitore | |
| 7,486,511 B1 | 2/2009 | Griffel | |
| 7,499,273 B2 | 3/2009 | Casebolt | |

(Continued)

OTHER PUBLICATIONS

U.S. Appl. No. 15/546,342, filed Mar. 10, 2017, Ambriz, Robert.

*Primary Examiner* — Mukund G Patel

(57) ABSTRACT

An air deflecting system includes an air deflector that is physically mounted against a hot air exhaust vent of a network equipment element using a rack coupling mechanism that is adjustable to accommodate a variable lateral distance of the hot air exhaust vent from the computing rack. The air deflector receives an airflow from the hot air exhaust vent at a first direction and deflects the airflow in a second direction.

14 Claims, 4 Drawing Sheets

(56) References Cited

U.S. PATENT DOCUMENTS

| | | |
|---|---|---|
| 7,500,911 B2 | 3/2009 | Johnson |
| 7,542,287 B2 | 6/2009 | Lewis, II |
| 7,595,985 B2 | 9/2009 | Adducci |
| 7,643,291 B2 | 1/2010 | Mallia |
| 7,751,188 B1 | 7/2010 | French |
| 7,752,858 B2 | 7/2010 | Johnson |
| 7,855,885 B2 | 12/2010 | Adducci |
| 7,862,410 B2 | 1/2011 | McMahan |
| 7,872,865 B2 | 1/2011 | Matsushima |
| 7,903,407 B2 | 3/2011 | Matsushima |
| 8,035,965 B2 | 10/2011 | Adducci |
| 8,144,464 B2 | 3/2012 | VanDerVeen |
| 8,154,870 B1 | 4/2012 | Czamara |
| 8,210,914 B2 | 7/2012 | McMahan |
| 8,300,410 B2 | 10/2012 | Slessman |
| 8,322,155 B2 | 12/2012 | Tutunoglu |
| 8,327,656 B2 | 12/2012 | Tutunoglu |
| 8,355,246 B2 | 1/2013 | Linhares |
| 8,434,804 B2 | 5/2013 | Slessman |
| 8,544,289 B2 | 10/2013 | Johnson |
| 8,591,300 B2 | 11/2013 | Slessman |
| 8,730,671 B2 | 6/2014 | VanDerVeen |
| 8,783,336 B2 | 7/2014 | Slessman |
| 8,848,367 B2 | 9/2014 | Adducci |
| 8,888,158 B2 | 11/2014 | Slessman |
| 9,137,930 B2 | 9/2015 | Alshinnawi |
| 9,237,672 B2 | 1/2016 | Slessman |
| 9,596,790 B2 | 3/2017 | Ambriz |
| 2005/0237716 A1 | 10/2005 | Chu |
| 2005/0280986 A1* | 12/2005 | Coglitore .......... H05K 7/20736 361/679.49 |
| 2010/0141105 A1 | 6/2010 | Slessman |
| 2014/0153183 A1 | 6/2014 | Pofahl et al. |
| 2014/0216683 A1 | 8/2014 | Meyer |
| 2014/0238639 A1 | 8/2014 | Ambriz et al. |
| 2015/0264836 A1 | 3/2015 | Ambriz |

* cited by examiner

EXHAUST AIR DEFLECTING SYSTEM

CROSS REFERENCE TO RELATED APPLICATIONS

This application is a continuation of and claims the benefit of priority to co-pending U.S. non-provisional application Ser. No. 14/097,986 entitled "EXHAUST AIR DEFLECTING SYSTEM," filed on Dec. 5, 2013, the entire contents of which are fully incorporated by reference herein for all purposes. Application Ser. No. 14/097,986 claims priority under 35 U.S.C. § 119 from U.S. provisional application No. 61/733,851 entitled "AIR DEFLECTOR," filed on Dec. 5, 2012, the entire contents of which are fully incorporated by reference herein for all purposes.

TECHNICAL FIELD

The disclosure generally relates to network equipment elements, and more particularly, to an exhaust air deflecting system.

BACKGROUND

Conventional computer equipment and, in particular networking equipment, employ air deflectors to direct and/or deflect the generated or exhausted warm air away from the equipment (e.g., in an upwards direction due to the natural flow of heated air). Some equipment manufacturers offer air deflectors that are specific to a certain model of equipment (i.e., specific to the dimensions of the equipment and/or placement of the exhaust system) and are fastened to the equipment itself. However, not all equipment manufacturers offer an air deflector associated with their products. Generally, when air deflectors are not included with equipment, generic air deflectors (e.g., curved plastic) may be used that attach to the equipment via a magnetic coupler and/or mechanism. Such a magnetic coupler can add an undesirable magnetic field near the equipment to which it is attached. Additionally, the magnetic coupler not have sufficient magnetism to keep the air deflector attached to the equipment while enduring the force of the air exhaust. Additionally, since many data center aisles are rather narrow, magnetically coupled air deflectors jutting into the aisle are easy to dislodge if bumped.

It is with these issues in mind, among others, that various aspects of the present disclosure were conceived.

SUMMARY

According to one aspect, an air deflecting system includes an air deflector that is physically mounted against an hot air exhaust vent of a network equipment element using a rack coupling mechanism that is adjustable to accommodate a variable lateral distance of the hot air exhaust vent from the computing rack. The air deflector receives an airflow from the hot air exhaust vent at a first direction and deflects the airflow in a second direction.

According to another aspect, a computing system includes a plurality of network equipment elements, a computing rack to house the network equipment elements, and an exhaust air deflector. The exhaust air deflector is physically mounted against an hot air exhaust vent of one of the network equipment elements using a rack coupling mechanism that is adjustable to accommodate a variable lateral distance of the hot air exhaust vent from the computing rack. The air deflector receives an airflow from the hot air exhaust vent at a first direction and deflects the airflow in a second direction.

BRIEF DESCRIPTION OF DRAWINGS

The foregoing and other objects, features and advantages of the disclosure will be apparent from the following description of particular embodiments of the disclosure, as illustrated in the accompanying drawings in which like reference characters refer to the same parts throughout the different views. The drawings are not necessarily to scale, emphasis instead being placed upon illustrating the principles of the disclosure.

DETAILED DESCRIPTION

Aspects of the present disclosure involve an air deflector that directs exhaust air up and away from computing equipment. Embodiments herein include an exhaust air deflector for computer and/or networking equipment that is mounted to a computing rack in which the computer and/or networking equipment resides (rather than attaching to the equipment itself). Such exhaust air deflectors can endure the force of the air exhaust and have sufficient durability for long term usage. The exhaust air deflector may be universal such that it may be used for varying computer and/or networking equipment models, sizes, dimensions, etc. Furthermore, such exhaust air deflectors do not have a magnetic coupler and/or mechanism that would cause undesirable magnetic fields near the computer and/or networking equipment, among other advantages.

Figure 1:
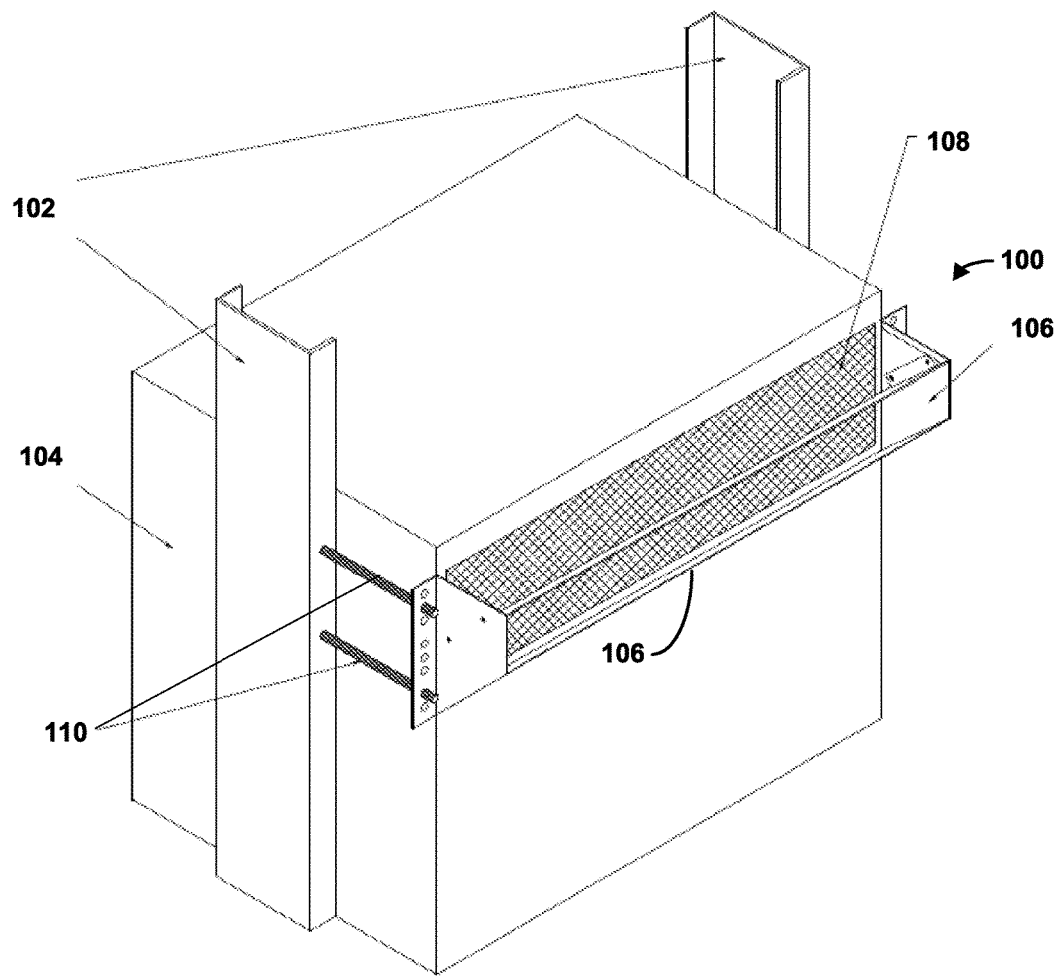
FIG. 1 depicts a perspective view of an example exhaust air deflector configured on a network equipment element of a computing rack according to the teachings of the present disclosure.

FIG. 1 depicts an example exhaust air deflecting system 100 according to the teachings of the present disclosure. The exhaust air deflector system 100 generally includes a computing rack 102 in which one or more network equipment elements 104 may be mounted. The exhaust air deflector system 100 also includes an exhaust air deflector 106 that may be mounted adjacent to hot air exhaust vents 108 of one of the network equipment elements 104 using an adjustable rack coupling mechanism 110. As will be described in detail below, the rack coupling mechanism 110 is adjustable to adapt to varying depths/dimensions of different networking equipment in relation to the positioning of the networking equipment within the rack.

The network equipment element 104 may be any type that is mountable and/or supported in a computing rack 102. Examples of such equipment include computing devices, blade servers, routers, switches, power supply units, and the like. In a particular example, the network equipment element 104 is a CIENA™, model 5410 core switch. The computing rack 102, network equipment elements 104, and exhaust air deflector 106 collectively form a computing system, such as a data center, computer cluster, or communication switch that provides one or more useful functions.

Figure 3:
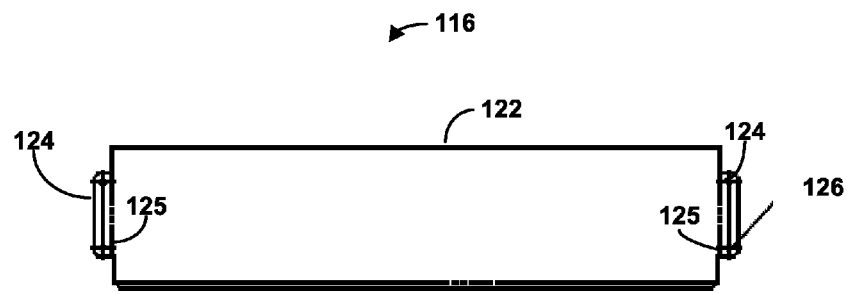
FIGS. 2 and 3 depict first and second sheets of metal that are used to construct the exhaust air deflector according to the teachings of the present disclosure.
Figure 2:
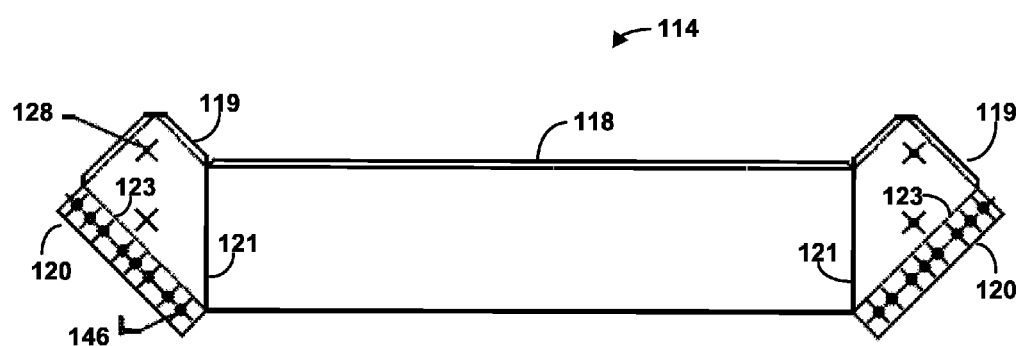

Referring now to FIGS. 2 through 6, various components of the exhaust air deflector 106 will be described. The exhaust air deflector 106 generally includes a first sheet of metal 114 cut to a shape as shown in FIG. 2, and a second sheet of metal 116 cut to a shape as shown in FIG. 3. The metal sheets as shown are made of carbon steel having a thickness of approximately 0.10 inches, but any type of material having any suitable thickness may be used. For example, exhaust air deflector 106 may be formed from plastic material that is injection molded into its final shape, and sufficiently heat tolerant to work with conventional exhaust air temperatures.

The first sheet of metal 114 includes a vane 118, having two sidewalls 119 and two flanges 120 integrally formed on both ends. When bent to shape along bend lines 121 formed by the interface between the vane 116, angled members 118, and bend lines 123 formed by the interface between the sidewalls 119 and the flanges 120, the angled members 118 cause the vane 116 to be oriented at an angle relative to the two flanges 120. Thus, when the flanges 120 are oriented vertically against the hot air exhaust vent 108 of the network equipment element 104, the vane 118 will be oriented at an ascending angle to divert an airflow emanating from the hot air exhaust vent 108 to a direction upwards from the horizontal direction.

The second sheet of metal 116 includes another vane 122 having two flange members 124 on either end. Bend lines 125 formed by an interface between the flange members 124 and the vane 122. When bent to shape along bend lines 125, the second sheet of metal 116 may be secured to the first sheet of metal 114 using bolts, rivets, or other attachment mechanisms inserted through holes 126 in the second sheet of metal 116 and holes 128 formed in the first sheet of metal 114. In this manner, two vanes 118 and 122 may be provided for upwardly deflecting a warm air exhaust airflow from a network equipment element 104. Although the particular embodiment describes the use of two vanes for deflecting an airflow, other numbers of vanes may be used, such as only one vane or three or more vanes. Additionally, although the present embodiment describes vanes configured to deflect an exhaust airflow that is exhausted in a substantially horizontal direction to an upward direction, it is contemplated that other embodiments may be configured to deflect an airflow having any initial direction to another direction that is different from the initial direction. For example, the exhaust airflow deflector 106 may be configured to deflect a horizontal airflow to a downward direction.

Figure 6:
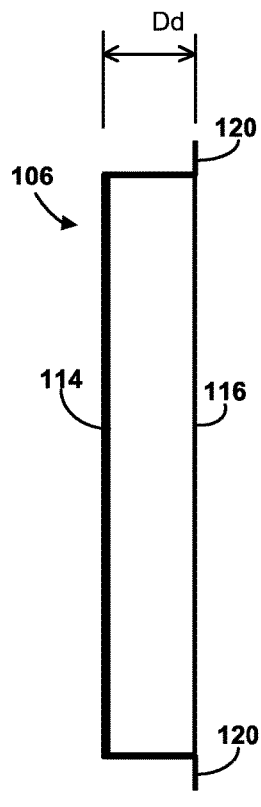
FIGS. 4 through 6 depict front, side, and top views, respectively, of the exhaust air deflector according to the teachings of the present disclosure.
Figure 5:
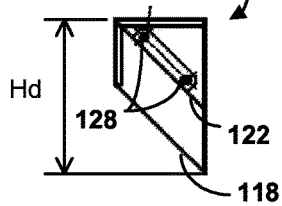
Figure 4:
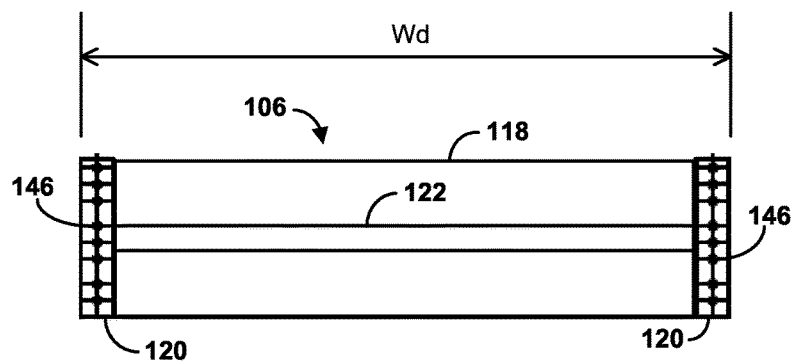

As introduced, the exhaust air deflector 106 may provide an advantage when used with network equipment elements that exhaust an airflow in a substantially horizontal direction. It is often the case that data centers are arranged with alternating cold air aisles and warm air aisles. In such an arrangement, cool air flows through air vents in the floor into the cool air aisle. Computing equipment and the associated racks are arranged so that that the sides of the equipment that intake cool air are facing the cool air aisle, and the warm air exhausts are all facing the warm air aisles. Furthermore, many data centers are arranged such that cool air is introduced through the floor, and warm air flows to cooling units by being exhausted into the warm air aisles and rising above the computing equipment and being drawn into a cooling unit's intake that is positioned on the top of the unit. Some network equipment elements generate exhaust airflows that are discharged in a substantially horizontal direction. Such an arrangement can cause warm air to discharge into equipment across aisle, may hamper or disrupt the cooling pattern for other computing racks positioned nearby, and is relatively inefficient in moving air upward into the flow to the cooling unit. The exhaust air deflector system 100 according to the teachings of the present disclosure provides a solution to these problems, and others, by deflecting the exhaust airflow from a network equipment element in an upward direction such that the airflow pattern of nearby computing racks is not unduly hampered or disrupted, and moves the air up into the warm air return flow as efficiently as possible FIGS. 4, 5, and 6 illustrate the exhaust air deflector 106 after the first sheet of metal 114 and the second sheet of metal 116 are bent to shape, and attached to one another. The exhaust air deflector 106 may have any size reasonably contemplated to span some or all of a network element and bridge between rack structures to which the deflector is attached. In one aspect, the exhaust air deflector 106 has a width Wd such that holes 146 configured in the flanges 120 have a similar distance to that of a conventional computing rack, such as a 19 inch computing rack or a 23 inch computing rack. More specifically, the distance Wd can be approximately the same as the width between opposing side rails of a computer rack, where a network element or other form of computing equipment fits between the side rails. Additionally, the exhaust air deflector 106 as shown has a height Hd of approximately 6.0 inches and a depth Dd of approximately 4.0 inches; nevertheless, any suitable dimensions may be used that deflects the airflow at a desired level.

When each of the first and second sheet of metal 114 and 116 are bent to shape and attached to one another, a multi-vane air deflector is formed for diverting an airflow from a hot air exhaust vent of a network equipment element configured in a computing rack. The vanes 188 are 122 are parallel to one another and are oriented at approximately a 45 degree angle relative to the flanges 120, although any suitable angular orientation may be used that causes the airflow to be diverted in a desired direction. Multiple vanes may provide an advantage in that a more laminar diversion of air flow may be obtained than would otherwise be provided by a single vane design that could potentially cause turbulent airflow that may, in turn, cause undue backpressure to the hot air exhaust vent and/or stagnant exhaust air proximate the network equipment element.

Figure 7B:
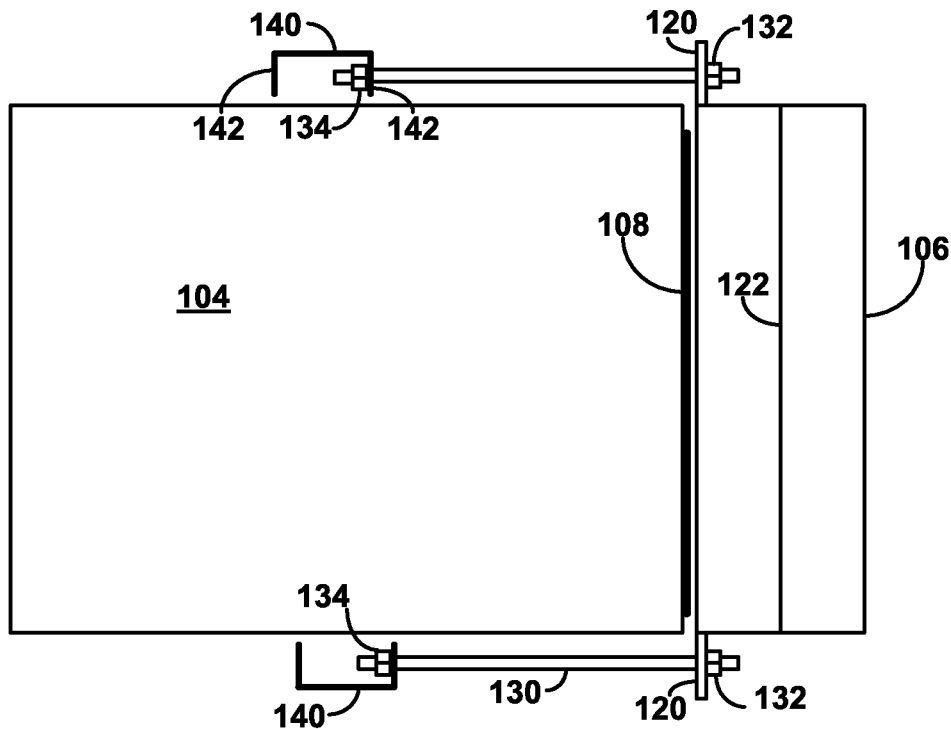
FIGS. 7A and 7B depict side and top views, respectively, of the example exhaust air deflector mounted on a network equipment element of a computing rack according to the teachings of the present disclosure.
Figure 7A:
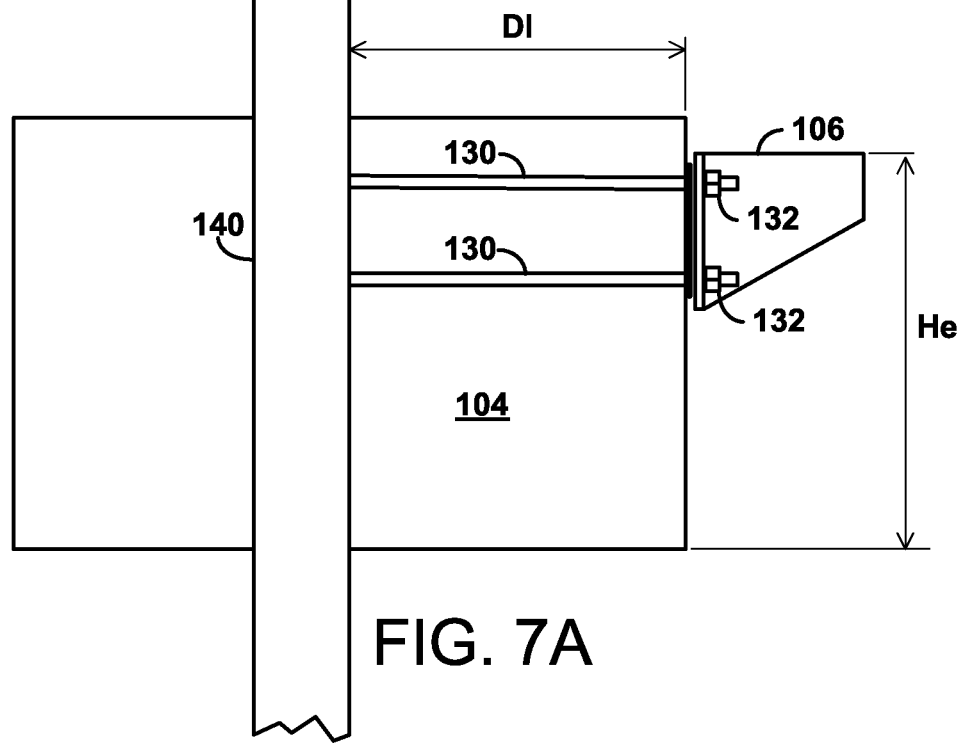

FIGS. 7A and 7B depict a side view and top view, respectively, of a computing rack 102 having a network equipment element 104 on which the example exhaust air deflector 106 is mounted according to the teachings of the present disclosure. As shown in this particular embodiment, the rack coupling mechanism comprises two pair of bolts 130 onto which nuts 132 may be screwed for securing the exhaust air deflector 106 to the network equipment element 104.

The bolts 130, as shown, each comprise an elongated section of metal rod that is threaded along its entire extent. Rods such as these are often referred to as 'all-thread'. Nevertheless other embodiments contemplate that that bolts 130 may have threaded sections that extend only along a portion of their extent. The threaded sections of the bolts allow the nuts 132 to be selectively screwed toward, or away from the rack 102 such that the exhaust air deflector 106 may be mounted against a network equipment element 104, which may project any lateral distance Dl from the computing rack 102. Stated differently, the elongate threaded bolt allows the air deflector to be mounted against the exhaust air side of a piece of computing equipment when the degree to which the equipment extends away from the side rails may vary relative to other equipment. Although the particular embodiment shown uses threaded bolts, other embodiments may include any type of structure that provides a tension force between the exhaust air deflector 106 and the rack 102 at varying lateral distances DI that may be encountered by the exhaust air deflector 106 configured in the rack 102. For example, an exhaust air deflector 106 may include on or more spacers that may selectively added to, or removed to provide a desired lateral distance for mounting the exhaust air deflector 106 to the network equipment element 104. As another example, the exhaust air deflector 106 may include one or more tension springs that physically couple the rack 102 to the exhaust air deflector 106 in a manner that exerts a tension force upon the exhaust air deflector 106 for maintaining the exhaust air deflector 106 adjacent to the network equipment element 104.

Referring to FIG. 7B, the rack 102 as shown includes two elongated sections of U-shaped rails 140 having flange portions 142 configured with multiple holes along their extent for attachment of multiple network equipment elements 104 on top of one another in the rack 102. Nevertheless, it should be understood that the teachings of the present disclosure may be applied to any type of computing rack, such as a computing rack having four elongated rail sections in which two of the rails are disposed on a first side (e.g., left side) of the network equipment, and the other two rails are disposed on the other side (e.g., right side) of the network equipment. In either case, the bolts 130 may each be secured to the rack 102 by inserting the bolts into these one of these holes and secured using nuts 134 screwed onto the bolts 130.

Nevertheless, certain scenarios may arise in which the holes configured in the rails are not in locations that are optimally suitable for mounting the exhaust air deflector 106 precisely over the hot air exhaust vent of the network equipment element 104. Accordingly, the flange 120 of the exhaust air deflector 106 is provided with a number of equally-spaced holes 146 (FIG. 2) into which the bolts may be inserted to provide a desired elevational height He of the exhaust air deflector 106 relative to that of the network equipment element 104 when mounted in the rack 102.

To use, it may ascertained that a network equipment element 104 configured in a computing rack 102 with one or more other network equipment elements emits a horizontal airflow that could be improved if the airflow were deflected in an upward direction. The network equipment element 104 has an air outlet 108 configured at any distance from the rails 140 of the computing rack 102. The user may then select one or more unused holes along the extent of the flange portions 142 of the rack 102 and insert the threaded bolts through these holes and apply nuts 134 to the back side of the rails 140. Next, the user may select certain holes 146 in the flange 120 of the exhaust air deflector 106 for insertion of the threaded bolts 130 such that the exhaust air deflector 106 is properly elevationally aligned with the air outlet 108 of the network equipment element 104. Once inserted nuts 132 may be screwed onto the bolts 130 and tightened to ensure that the exhaust air deflector 106 remains in proper position against the air outlet 108 of the network equipment element 104.

Although the present disclosure has been described with reference to various embodiments, it will be understood that the disclosure is not limited to the details thereof. Various modifications and substitutions will occur to those of ordinary skill in the art. All such substitutions are intended to be embraced within the scope of the disclosure as defined in the appended claims.

What is claimed is:

1. An apparatus comprising:
an air deflector to receive an airflow in a first direction and deflect the airflow in a second direction, the airflow discharged through a hot air exhaust vent of a network equipment element configured in a computing rack, the air deflector comprising a first vane and a second vane parallel to each other, the first vane and the second vane oriented relative to the hot air exhaust vent at a specified angle to deflect the airflow in the second direction, wherein the air deflector is separate from the computing rack; and
a rack coupling mechanism to physically mount the air deflector against the hot air exhaust vent of the network equipment element thereby connecting the air deflector to the computing rack, the rack coupling mechanism being adjustable to accommodate a variable lateral distance of the hot air exhaust vent from the computing rack;
wherein the computing rack comprises a pair of opposing vertically oriented U-shaped rails configured with multiple holes, the network element positioned between the rails and the holes of the rails being spaced relative to a height of the network element, a first bolt of a pair of bolts secured in one of the holes of a first rail of the pair of rails and a second bolt of the pair of bolts secured in one of the holes of a second rail of the pair of rails.

2. The apparatus of claim 1, wherein the specified angle is 45 degrees.

3. The apparatus of claim 1, wherein each of the first bolt and the second bolt are secured in one of a plurality of spaced apart holes of each of a pair of flanges configured on opposing sides of the air deflector such that the air deflector is positioned at a height sufficient to cover the hot air exhaust vent.

4. The apparatus of claim 1, wherein the air deflector is formed from a first planar sheet of metal that, when bent to its final shape, forms the first vane of the air deflector.

5. The apparatus of claim 4, wherein the second vane comprises a second planar sheet of metal.

6. The apparatus of claim 1, wherein the first direction is a horizontal direction and the second direction is upwards of the horizontal direction.

7. A computing system comprising:
a plurality of network equipment elements;
a computing rack housing the network equipment elements; and
an exhaust air deflector to receive an airflow from at least one network equipment element in a first direction and deflect the airflow in a second direction, the exhaust air deflector physically mounted against a hot air exhaust vent of the one network equipment element using a rack coupling mechanism that is adjustable to accommodate a variable lateral distance of the hot air exhaust vent from the computing rack, the exhaust air deflector comprising a first vane and a second vane parallel to each other, the first vane and the second vane oriented relative to the hot air exhaust vent at a specified angle to deflect the airflow in the second direction;
wherein the computing rack comprises a pair of opposing vertically oriented U-shaped rails configured with multiple holes, the network element positioned between the rails and the holes of the rails being spaced relative to a height of the network element, a first bolt of a pair of bolts secured in one of the holes of a first rail of the pair of rails and a second bolt of the pair of bolts secured in one of the holes of a second rail of the pair of rails.

8. The computing system of claim 7, wherein each of the first bolt and the second bolt are secured in one of a plurality of spaced apart holes of each of a pair of flanges configured on opposing sides of the air deflector such that the exhaust air deflector is positioned at a height sufficient to cover the hot air exhaust vent.

9. The computing system of claim 7, wherein the exhaust air deflector is formed from a first planar sheet of metal that, when bent to its final shape, forms the first vane of the air deflector.

10. The computing system of claim 9, wherein the second vane comprises a second planar sheet of metal.

11. The computing system of claim 7, wherein the first direction is a horizontal direction and the second direction is upwards of the horizontal direction.

12. An air exhaust system comprising:
an air deflector to receive an airflow in a first direction and deflect the airflow in a second direction, the airflow discharged through a hot air exhaust vent of a network equipment element configured in a computing rack; and
a rack coupling mechanism to physically mount the air deflector against the hot air exhaust vent of the network equipment element, the rack coupling mechanism being adjustable to accommodate a variable lateral distance of the hot air exhaust vent from the computing rack,
wherein the computing rack comprises a pair of opposing vertically oriented U-shaped rails configured with multiple holes, the network element positioned between the rails and the holes of the rails being spaced relative to a height of the network element, a first bolt of a pair of bolts secured in one of the holes of a first rail of the pair of rails and a first flange configured on a first side of the air deflector, and a second bolt of the pair of bolts secured in one of the holes of a second rail of the pair of rails and a second flange configured on a second side of the air deflector.

13. The air exhaust system of claim 12, wherein the air deflector is formed from a first planar sheet of metal that, when bent to its final shape, forms at least one vane of the air deflector, and wherein the air deflector comprises a second vane formed from a second planar sheet of metal.

14. The air exhaust system of claim 12, wherein the first direction is a horizontal direction and the second direction is upwards of the horizontal direction.

* * * * *